United States Patent [19]
Hause et al.

[11] Patent Number: 6,051,863
[45] Date of Patent: Apr. 18, 2000

[54] TRANSISTOR GATE CONDUCTOR HAVING SIDEWALL SURFACES UPON WHICH A SPACER HAVING A PROFILE THAT SUBSTANTIALLY PREVENTS SILICIDE BRIDGING IS FORMED

[75] Inventors: Fred N. Hause, Austin; Mark I. Gardner, Cedar Creek; Charles E. May, Austin, all of Tex.

[73] Assignee: Advanced Micro Devices, Inc., Sunnyvale, Calif.

[21] Appl. No.: 08/975,582

[22] Filed: Nov. 21, 1997

[51] Int. Cl.<sup>7</sup> ..................................... H01L 29/76
[52] U.S. Cl. .................. 257/369; 257/344; 257/283; 438/230; 438/265; 438/303; 438/595
[58] Field of Search .................... 257/344, 369, 257/374, 900, 650, 635, 644, 283; 438/196, 230, 265, 303, 595

[56] References Cited

U.S. PATENT DOCUMENTS 5,517,045  5/1996  Ho et al. ................................. 257/327
5,818,092  10/1998 Bai et al. ................................ 257/388

*Primary Examiner*—Sheila V. Clark
*Assistant Examiner*—H. D. Tran

*Attorney, Agent, or Firm*—Kevin L. Daffer; Conley, Rose & Tayon

[57] ABSTRACT

A method is provided for fabricating a transistor gate conductor having opposed sidewall surfaces upon which dielectric spacers are formed such that the spacer profile substantially tapers toward the adjacent gate conductor sidewall surface as it approaches the base of the gate conductor. More particularly, formation of the sidewall spacers involves anisotropically etching a dielectric material deposited across a semiconductor topography in the presence of a passivant source to form a passivant upon portions of the dielectric material. The passivant primarily accumulates upon the upper portion of lateral surfaces of the dielectric material. An isotropic etch which occurs at the same rate in all directions is used to etch portions of the dielectric material not completely covered by the passivant. The resulting spacers have a varying thickness which decreases from top to bottom. Thus, when a silicide-forming metal is deposited, the metal accumulates at the peak of each spacer and is inhibited from being deposited upon the lower portions of the spacers, thereby preventing silicide bridging between the gate conductor and ensuing source/drain regions of the transistor.

5 Claims, 5 Drawing Sheets

TRANSISTOR GATE CONDUCTOR HAVING SIDEWALL SURFACES UPON WHICH A SPACER HAVING A PROFILE THAT SUBSTANTIALLY PREVENTS SILICIDE BRIDGING IS FORMED

BACKGROUND OF THE INVENTION

1. Field of the Invention

This invention relates to integrated circuit fabrication and, more particularly, to a gate conductor with opposed sidewall surfaces upon which a spacer is formed having a tapering profile that is less susceptible to accumulation of a silicide-forming metal.

2. Description of the Relevant Art

Fabrication of a MOSFET device is well known. Generally speaking, MOSFETs are manufactured by placing an undoped polycrystalline ("polysilicon") material over a relatively thin gate oxide. The polysilicon material and the gate oxide are then patterned to form a gate conductor with source/drain regions adjacent to and on opposite sides of the gate conductor. The gate conductor and source/drain regions are then implanted with an impurity dopant species. If the impurity dopant species used for forming the source/drain regions is n-type, then the resulting MOSFET is an NMOSFET ("n-channel") transistor device. Conversely, if the source/drain dopant species is p-type, then the resulting MOSFET is a PMOSFET ("p-channel") transistor device. Integrated circuits utilize either n-channel devices exclusively, p-channel devices exclusively, or a combination of both on a single substrate. While both types of devices can be formed, the devices are distinguishable based on the dopant species used.

Conventional transistor formation involves implantation of a light concentration of dopant self-aligned to the gate conductor followed by implantation of a heavier concentration of dopant self-aligned to the gate conductor on which two sidewall spacers have been formed. The purpose of the first implant dose is to produce a lightly doped drain ("LDD") section within the active area (i.e., junction) at the gate edge near the channel. The second implant dose is spaced from the channel a distance dictated by the thickness of the sidewall spacer. The second implant dose forms a heavily doped source/drain region within the junction laterally outside the LDD section.

A transistor employing sidewall spacers formed using the technique described above is depicted in FIG. 1. A gate conductor 24 is spaced above a semiconductor substrate 20 by a gate oxide 22. Dielectric sidewall spacers 28 are arranged upon the opposed sidewall surfaces of gate conductor 24. Spacer 28 may be composed of, for example, silicon dioxide ("oxide") or silicon nitride ("nitride"). LDD areas 26 are disposed within substrate 20 directly underneath sidewall spacers 28. Source/drain regions 30 are arranged within substrate 20 laterally adjacent LDD areas 26. The profile of each of the sidewall spacers 28 tapers away from an adjacent sidewall surface of gate conductor 24 as it approaches the surface of substrate 20. As such, the profile of the leftmost spacer is positively sloped, and the profile of the rightmost spacer is negatively sloped. This configuration of sidewall spacers 28 is a result of the etch technique used to define the spacers. Typically, a plasma etch technique is employed that is anisotropic in nature so as to promote more frequent ion bombardment upon vertical surfaces than horizontal surfaces of the spacer material. Unfortunately, ion bombardment is typically not completely anisotropic, and some ions manage to strike exposed vertical surfaces. Thus, during the formation of oxide sidewall spacers 28, corner regions of the dielectric being etched are attacked from two directions. The exposed surfaces of the resulting sidewall spacers 28 are thus non-vertical. The sidewall spacers 28 have a varying thickness which increases from the top to the bottom of the spacers.

Integrated circuit formation involves electrical linkage of various active devices, i.e., transistors. Ohmic contacts are formed in contact "windows" that extend through an inter-level dielectric to silicon-based junctions and/or polycrystalline silicon ("polysilicon") gates of transistors, and multiple levels of dielectrically isolated interconnect are routed to the contacts. In order to form highly conductive ohmic contacts in the windows between transistors and overlying interconnect, it is oftentimes necessary to incorporate a layer of refractory metal at the junctures. The refractory metal, when subjected to a sufficient temperature, reacts with the underlying silicon in the contact window to form a low resistivity "silicide". Any unreacted metal is removed after formation of the silicide. Since the silicide reaction occurs wherever refractory metal is in contact with a region heavily concentrated with silicon, a self-aligned silicide ("salicide") results exclusively upon silicon-based junctions and polysilicon gates.

FIG. 2 depicts the physical vapor deposition ("PVD") of a refractory metal layer 32, e.g., titanium, from a metal target onto exposed surfaces of the semiconductor topography depicted in FIG. 1. Since PVD is a line-of-sight process in which deposition occurs upon the first encountered surface, the step coverage of refractory metal layer 32 is dependent on the orientation of the underlying topological features. Dependency on the orientation is often referred to as a "collimated" deposition in that columns of deposited material generally accumulate perpendicular to horizontally oriented topological surfaces. Therefore, the tapering, non-vertical profiles of sidewall spacers 28 permit deposited metal to accumulate upon the exposed surfaces of the spacers. As further illustrated in FIG. 2, refractory metal layer 32 may be exposed to an anneal cycle 34 in order initiate reaction between the metal and underlying silicon to form silicide.

As shown in FIG. 3a, a silicide 36 is formed upon source/drain regions 30 and the upper surface of gate conductor 24. The anneal cycle 34 is performed at relatively high temperatures above 600° C., and thus promotes cross-diffusion of silicon atoms in spacers 28 and metal atoms in refractory metal layer 32. FIG. 3b depicts a detailed view along section 3b of FIG. 3a. Some of the silicon atoms 40 of spacer 28 have bonded to metal atoms 38 to form silicide in close proximity to the surface of spacer 28. Unfortunately, the presence of silicide in spacers 28 may lead to capacitive coupling or formation of a fully conductive path between polysilicon gate conductor 24 and adjacent source/drain regions 30. This undesirable phenomenon is often referred to as silicide shorting or "bridging".

Many researchers and manufacturers advocate a multiple step silicide formation process to help address the bridging problem. First, a refractory metal, such as titanium is deposited over the entire topography. Next, the metal is heated to a low temperature in the presence of a nitrogen ambient to form a reacted, relatively high resistance silicide in the contact windows. The unreacted metal is then removed using a wet chemical etch (e.g., $NH_4OH:H_2O_2:H_2O$) while retaining reacted metal or metal silicide in the contact windows. Finally, a higher temperature anneal is performed in order to produce a lower resistivity silicide in regions where the metal has previously reacted.

The two-step anneal process is not always successful, especially if the anneal temperature cycles are not carefully monitored and controlled. If the first anneal temperature is too high, then the sidewall spacers might be partially consumed and/or metal atoms might readily migrate into the spacers where they can bond with silicon atoms to deleteriously cause silicide shorting. Thus, the first anneal temperature must be carefully maintained and is highly dependent on the thickness of titanium across the spacer sidewall. Moreover, extraction of the wafer and the reacted metal silicide in the interim between the two step anneal process may place impurities or native oxides in the contact window above the gate conductor and the source/drain regions.

It is therefore desirable that a semiconductor fabrication process be developed which need not be concerned with silicide bridging. More specifically, a process is needed in which refractory metal is altogether absent from the sidewall spacers arranged upon opposed sidewall surfaces of a transistor gate conductor. If refractory metal is prevented from contacting the sidewall spacers, silicon atoms in the spacers would have no metal atoms with which to bond and form silicide. Substantially minimizing, if not eliminating, metal from the sidewall spacers would lessen the concerns associated with high temperature anneal cycles and two-step anneal cycles.

SUMMARY OF THE INVENTION

The problems outlined above are in large part solved by the technique hereof for fabricating a transistor gate conductor having opposed sidewall surfaces upon which dielectric spacers are formed such that the spacer profile substantially tapers toward the adjacent gate conductor sidewall surface as it approaches the base of the gate conductor. More particularly, formation of the sidewall spacers involves anisotropically etching a dielectric material deposited across a semiconductor topography in the presence of a passivant source, e.g., $CHF_3$, to form a passivant upon portions of the dielectric material. Herein, a "passivant" is a material that protects a topological surface upon which it is deposited from exposure to species, such as ions. An isotropic etch which occurs at the same rate in all directions is used to etch portions of the dielectric material not completely covered by the passivant.

Since anisotropic etch involves more frequent ion bombardment upon horizontal surfaces than vertical surfaces, most of the passivant that forms upon horizontal surfaces is removed. Further, a substantial portion of the passivant deposited upon curved transition surfaces between horizontal surfaces and vertical surfaces is removed. The passivant that accumulates upon the more vertical surfaces, however, is subjected to the least amount of ion ablation. As such, more passivant preferably becomes disposed upon the upper portion of lateral surfaces of the dielectric material during the anisotropic etch step. Therefore, when the isotropic etch is performed on the dielectric material, the portions of the dielectric material protected by the passivant are not attacked. Because the lower curved transition surfaces of the dielectric material are attacked from multiple directions during the isotropic etch, more of the dielectric material is removed from the curved surfaces than from the vertical and horizontal surfaces. The isotropic etch is terminated after the dielectric material has been removed from all regions except the sidewall surfaces of the gate conductor. The resulting sidewall spacers thus have a varying thickness which decreases from the top to the bottom of the spacers. The thicker regions of the sidewall spacers are those that had been protected by the passivant.

After a transistor has been formed which employs the gate conductor and the unusually shaped spacers, silicide may be formed upon silicon-based source/drain regions of the transistor and upon the gate conductor which comprises polysilicon. A refractory metal is first PVD deposited from a metal target, e.g., titanium target. The profile of the spacers advantageously prevents or reduces accumulation of refractory metal upon the spacers. As described earlier, the PVD of the refractory metal is a collimated deposition in which material propagates perpendicular to horizontally oriented topological features. As such, the refractory metal becomes deposited upon the nearest horizontal surface. Because the peak of the spacer profile extends farther from the adjacent sidewall spacer of the gate conductor than other portions of the profile, the deposited metal strikes the horizontally oriented peak before it can reach other portions of the profile. As a result no silicide-forming metal is allowed to accumulate upon the lower portions of the spacers. Consequently, when the refractory metal is subsequently subjected to a heat cycle, no metal is present upon the spacers with which silicon atoms can react to form silicide. Thus, salicide forms exclusively upon the upper surface of the gate conductor (known as "polycide") and the source/drain regions of the transistor. Advantageously, since silicide formation upon the lower regions of the spacers is inhibited, an electrical short forming between the gate conductor and adjacent source/drain regions is less likely. The dielectric spacers may therefore provide adequate protection against the gate conductor becoming electrically linked to the source/drain regions. Furthermore, a single relatively high temperature anneal may be used to form the silicide since the possibility of silicide formation in the spacers is reduced.

A preferred embodiment of the invention contemplates the formation of a transistor to be employed by an integrated circuit. A gate oxide is deposited across a semiconductor substrate, and a polysilicon layer is deposited across the gate oxide. Portions of the gate oxide and polysilicon layer are etched away to define a pair of opposed sidewall surfaces of a polysilicon gate conductor. An LDD implant self-aligned to the sidewall surfaces of the gate conductor may then be forwarded into the substrate. A dielectric material it deposited across exposed surfaces of the semiconductor topography. The dielectric material is preferably oxide, but may be other materials as well, such as nitride. The semiconductor topography is then positioned within a plasma etching apparatus. A plasma is then generated within the reaction chamber from a gas comprising fluorine-containing molecules, carbon-containing molecules, and bromine-containing molecules. More specifically the gas comprises $SF_6$, $CHF_3$, and HBr. A relatively low radio frequency ("RF") power is used to generate the plasma The resulting ions have a relatively low energy, e.g., less than approximately 50 eV.

The carbon-containing molecules become excited and adsorb upon surfaces of the oxide where they dissociate. These excited molecules form a passivant, such as a carbon-containing polymer upon the surfaces of the dielectric. The ion flux is controlled such that ions primarily bombard exposed horizontal surfaces. Consequently, the horizontally oriented surfaces of the oxide and the passivant are removed more quickly than vertically oriented surfaces. Although ion bombardment may also occur upon vertically oriented features, the low energy and low frequency of the ion bombardment permits a substantial portion of the passivant to remain upon the more vertical upper portion of lateral surfaces of the oxide. Since some of the dissociated carbon reacts with oxygen atoms of the oxide, volatile C—O containing molecules may form. As a result, the deposition rate of non-volatile passivant upon the oxide is sufficiently slow to permit anisotropic etching of the oxide. During the anisotropic etch, the fluorine and bromine molecules appear to serve as reducing agents of the oxide.

In an alternate embodiment in which the dielectric material is composed of nitride, helium may also be provided to the plasma to improve the etch rate of the nitride. In yet another embodiment, a molecule containing an outer low energy empty electron orbital, e.g., CO, $CO_2$, and $NO_2$, may be added to the plasma to promote the formation of a passivant. These molecules may form relatively weak bonds with dangling bonds of the dielectric. Such weak bonds are easily broken if bombarded with ions. However, the bonds that are not impinged by ions, i.e., those at vertical surfaces, act as a passivant 30 which prevents the dielectric from being attacked by etchants.

The anisotropic etch is terminated after substantial portions of the dielectric material arranged upon horizontal surfaces have been removed and a substantial portion of passivant has accumulated upon the upper portion of lateral surfaces of the dielectric material. The dielectric material is then isotropically etched using, e.g., a gas comprising fluorine-containing molecules. The gas, absent energetic ions, diffuses to the dielectric surfaces where it etches exposed dielectric material at the same rate in all directions. The presence of the passivant upon the upper portion of lateral surfaces of the dielectric protects that portion of the lateral surfaces from being etched. Consequently, dielectric spacers are formed upon the opposed sidewall surfaces of the gate conductor that each have a profile which tapers toward the adjacent sidewall surface as it approaches the semiconductor substrate. Formation of the transistor is completed by forwarding a source/drain implant into exposed regions of the semiconductor substrate.

BRIEF DESCRIPTION OF THE DRAWINGS

Other objects and advantages of the invention will become apparent upon reading the following detailed description and upon reference to the accompanying drawings in which.

DETAILED DESCRIPTION OF THE INVENTION

Figure 1:
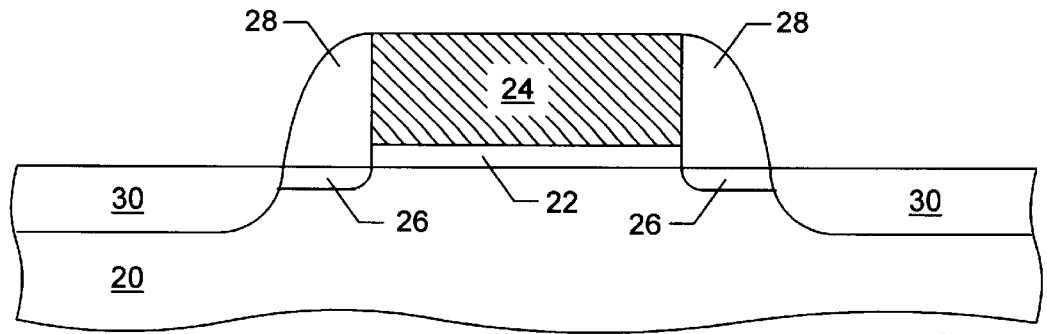
FIG. 1 is a cross-sectional view of a semiconductor topography, wherein sidewall spacers have been formed upon opposed sidewall surfaces of a transistor gate conductor, according to convention design.
Figure 2:
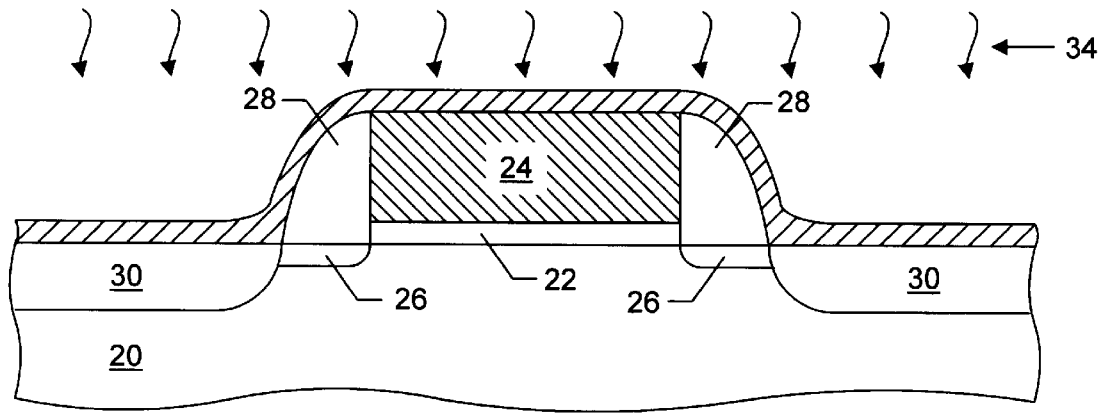
FIG. 2 is a cross-sectional view of the semiconductor topography, wherein a refractory metal layer is deposited across exposed surfaces and subjected to a heat cycle, subsequent to the step in FIG. 1.
Figure 3B:
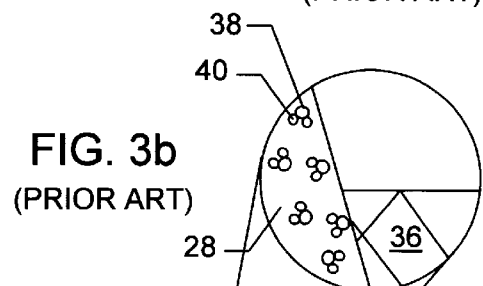
FIG. 3b is a detailed view along section 3b of FIG. 3a showing that silicide is formed within the sidewall spacers.
Figure 3A:
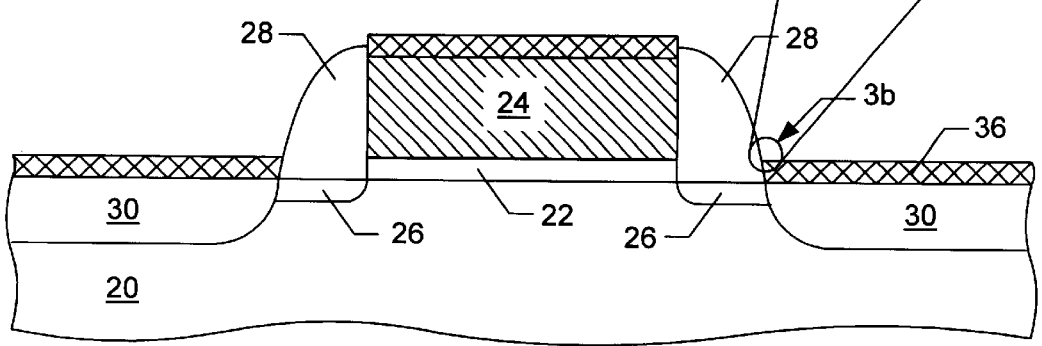
FIG. 3a is a cross-sectional view of the semiconductor topography, wherein an silicide is formed as a result of silicon atoms reacting with metal atoms, subsequent to the step in FIG. 2.
Figure 4:
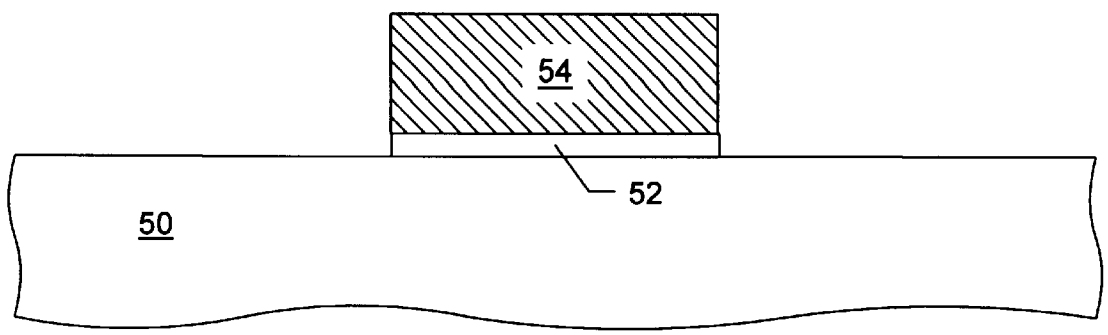
FIG. 4 is a cross-sectional view of a semiconductor topography, wherein a gate conductor and a gate dielectric arranged above a semiconductor substrate are provided according to an embodiment of the present invention.

Turning now to the drawings, FIG. 4 illustrates a semiconductor substrate 50 upon which a gate dielectric 52 has been formed. A polysilicon gate conductor 54 is arranged upon gate dielectric 52. Substrate 50 may comprise single crystalline silicon and dielectric isolation regions arranged a spaced distance apart for dielectrically isolating ensuing active areas. Substrate 50 is slightly doped with n-type of p-type impurities. Gate dielectric 52 is composed of a thermally grown oxide. Polysilicon gate conductor 54 may have been formed using chemical vapor deposition ("CVD") of polysilicon from a silane source. The opposed sidewall surfaces of polysilicon gate conductor 54 may have been defined by etching portions of the polysilicon and the oxide not covered by a patterned photoresist layer using, e.g., a plasma etch technique.

Figure 5:
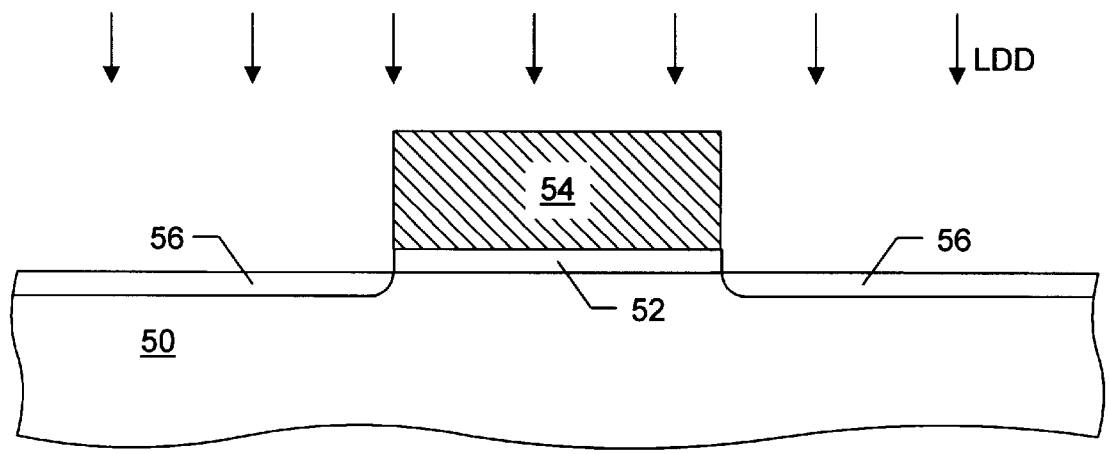
FIG. 5 is a cross-sectional view of the semiconductor topography, wherein an LDD implant self-aligned to the sidewall surfaces of the gate conductor is forwarded to the substrate, subsequent to the step in FIG. 4.
Figure 6:
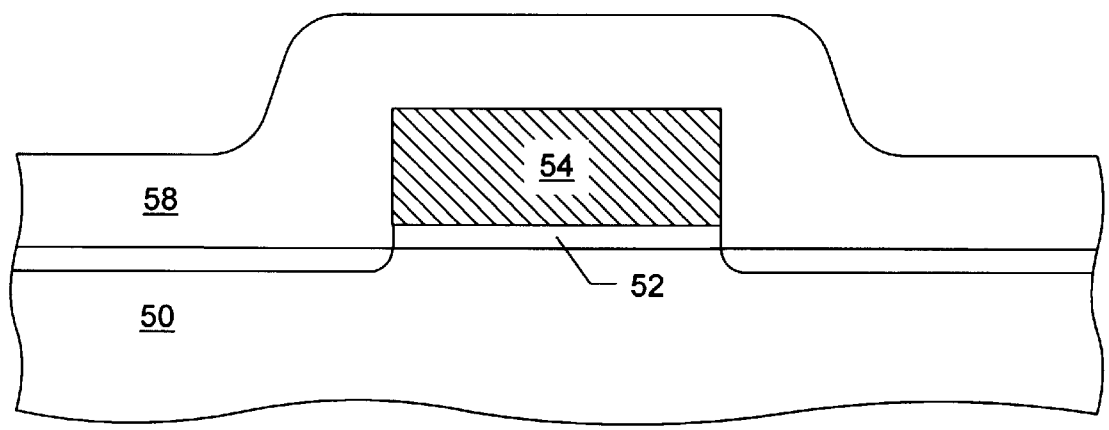
FIG. 6 is a cross-sectional view of the semiconductor topography, wherein a dielectric material is deposited across exposed surfaces of the gate conductor and the substrate, subsequent to the step in FIG. 5.

Turning to FIG. 5, an LDD implant aligned to the opposed sidewall surfaces of gate conductor 54 may then be forwarded into the exposed regions of semiconductor substrate 50. As a result, LDD areas 56 are formed within regions of substrate 50 laterally adjacent gate conductor 54. The LDD areas 56 preferably contain a light concentration of dopants that are opposite in type to the dopants implanted within the channel region of substrate 50. FIG. 6 illustrates the CVD of a dielectric material 58 across exposed surfaces of substrate 50 and gate conductor 54. Dielectric material 58 preferably comprises oxide deposited from, e.g., a silane and oxygen bearing source. Alternately, dielectric material 58 may be composed of, in one instance, nitride deposited from, e.g., a silane and nitrogen bearing source.

Figure 7:
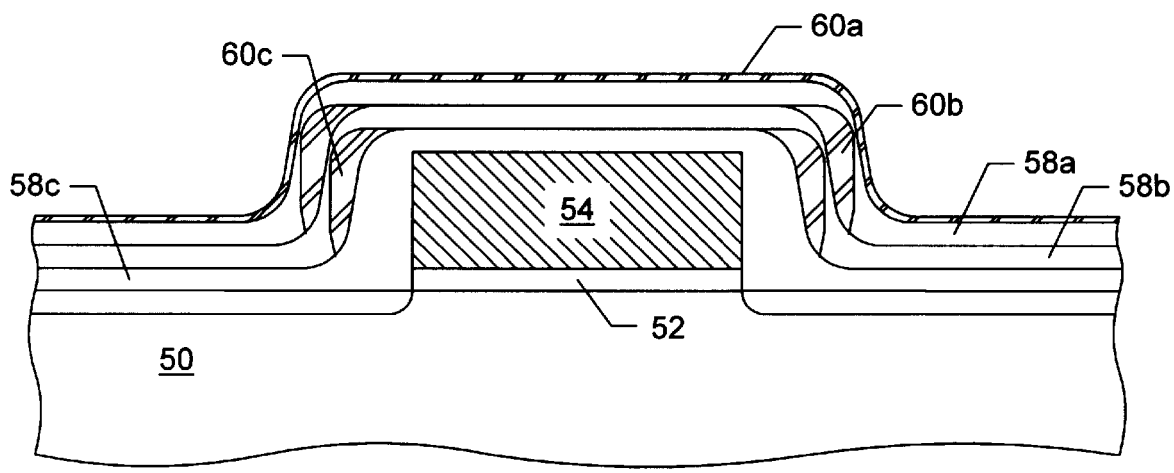
FIG. 7 is a cross-sectional view of the semiconductor topography, wherein the dielectric material is anisotropically etched while a passivant is being deposited upon the surfaces of the dielectric material, subsequent to the step in FIG. 6.
Figure 8:
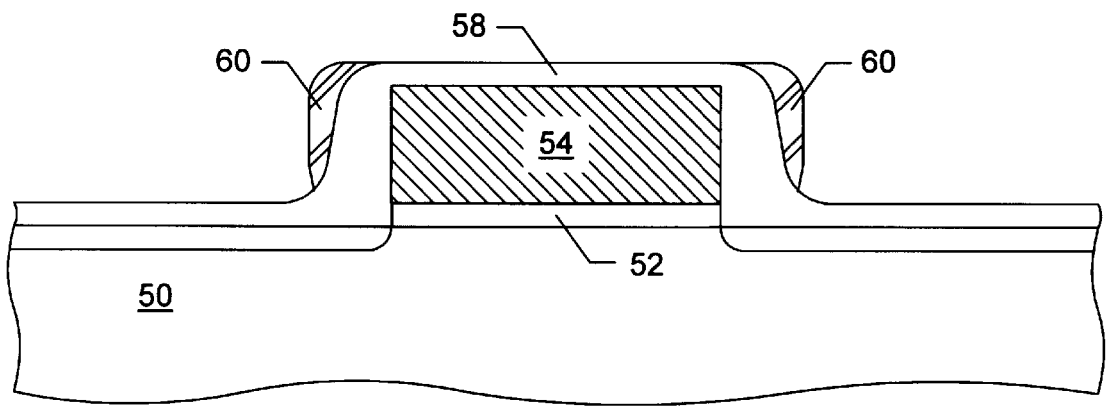
FIG. 8 is a cross-sectional view of the semiconductor topography, wherein the passivant is retained upon the upper portion of lateral surfaces of the dielectric material during the anisotropic etch, subsequent to the step in FIG. 7.
Figure 9:
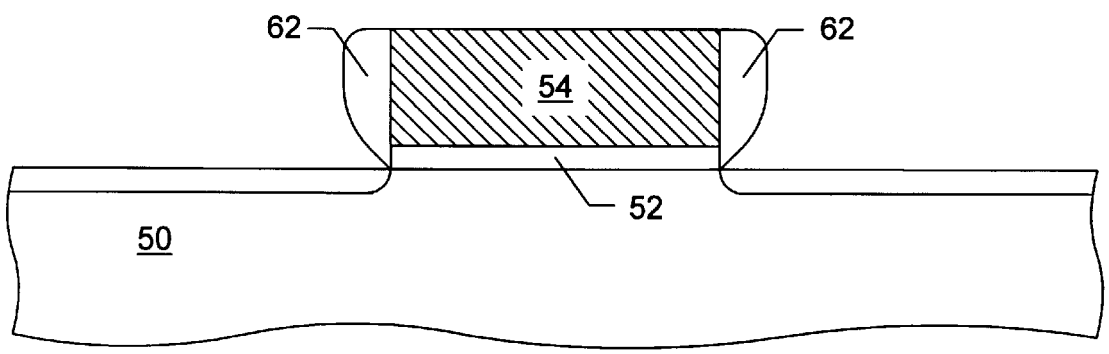
FIG. 9 is a cross-sectional view of the semiconductor topography, wherein portions of the dielectric material not protected by the passivant are isotropically etched to form spacers upon the sidewall surfaces of the gate conductor, wherein the spacer profile tapers toward the gate conductor as it approaches the substrate, subsequent to the step in FIG. 8.
Figure 13:
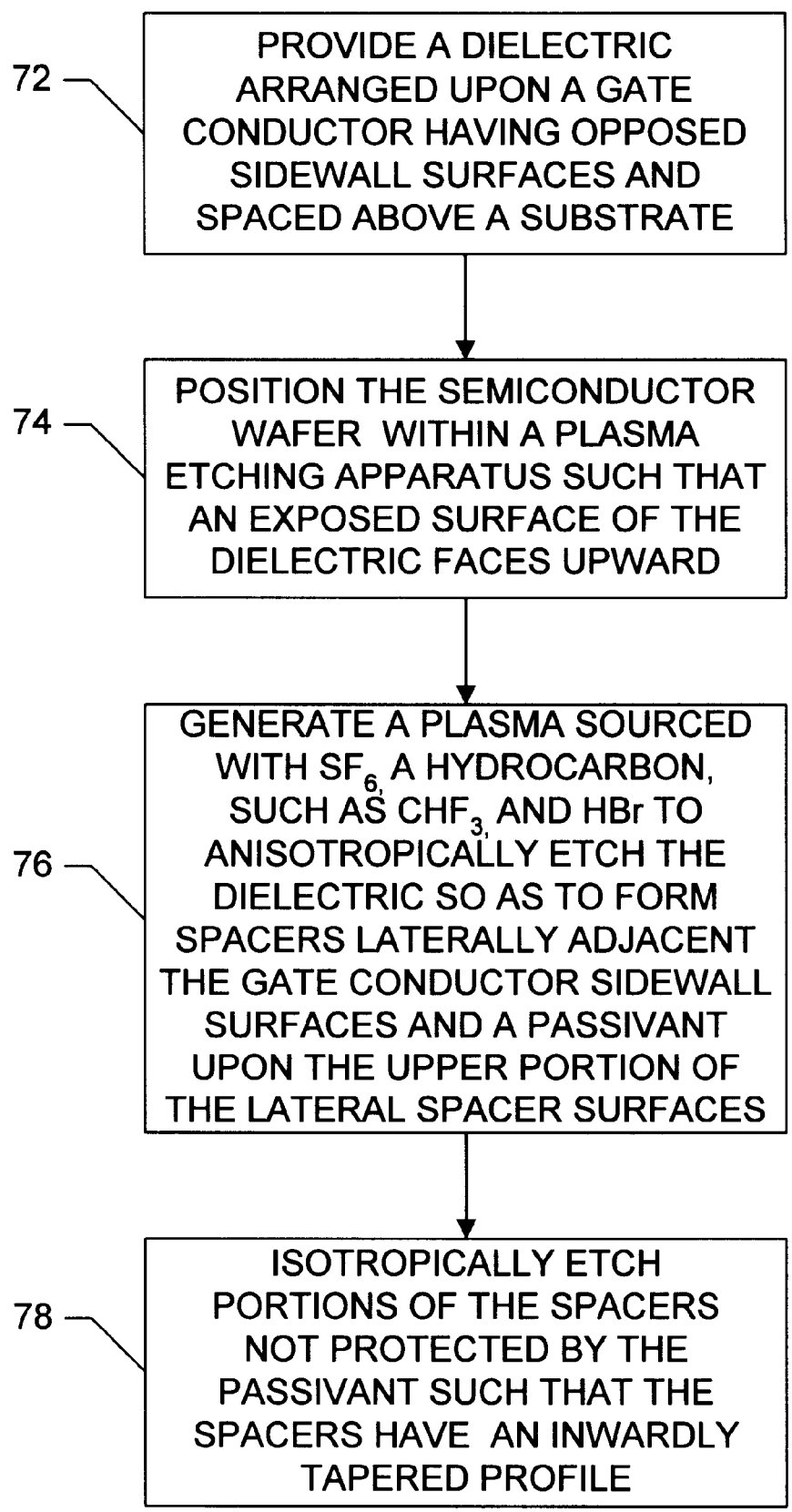
FIG. 13 is a flow diagram of the steps used to form the sidewall spacers upon the opposed sidewall surfaces of the gate conductor.

FIGS. 7–9 depict the formation of sidewall spacers 62 upon the opposed sidewall surfaces of gate conductor 54. FIG. 13 is a flow diagram of the steps used to form sidewall spacers 62. As described in block 74 of FIG. 13, the provided semiconductor topography is first positioned within a plasma etching apparatus with the exposed surface of dielectric material 58 facing upward. Preferably, the plasma etching apparatus is a parallel electrode reactor in which the upper electrode is connected to the RF power supply and the lower electrode is connected to ground. The semiconductor topography is positioned upon the grounded electrode of the parallel electrode reactor. The resulting system is said to be configured in a plasma etch mode as opposed to a reactive ion etching ("RIE") mode in which wafers are positioned upon an RF-powered electrode. As described in block 76 of FIG. 13, a plasma sourced with fluorine-containing molecules (e.g., $SF_6$, $C_2F_6$, or $C_3F_8$), carbon-containing molecules (e.g., $CHF_3$ or $CH_4$), and bromine-containing molecules (e.g., HBr) is generated within the reactor chamber. The pressure of the reaction chamber is maintained between approximately 0.1 and 5 Torr, and the RF power is maintained between approximately 100 and 300 Watts. It is to be understood that the pressure and RF power are limited only to these values. Since the plasma etching apparatus is configured in the plasma etch mode, relatively high energies of bombarding ions are avoided. Excited carbon-containing molecules adsorb upon the surface of dielectric material 58 where they undergo a surface recombinant reaction to form a polymer passivant 60. The plasma may also be sourced with molecules having outer low energy empty electron orbitals (e.g., CO, $CO_2$, $H_2O$, $NO_2$, $N_2$, NOCl, COS, or $CS_2$). These molecules may form weak bonds with dangling bonds of dielectric material 58, thereby forming a passivant.

Excited bromine atoms and fluorine atoms that adsorb upon the surfaces of dielectric material 58 function as reducing agents of the oxide or nitride within the dielectric material. If dielectric material 58 is composed of nitride, the anisotropic etch plasma may further be provided with helium so as to increase the etch rate of the nitride. The flux of ions and excited molecules created in the plasma is controlled so as to remove dielectric material 58 from above horizontal surfaces more quickly than from above vertical surfaces.

FIG. 7 illustrates the transition of dielectric material 58 through three sequential stages, 58a, 58b, and 58c, as it is being anisotropically etched. As the anisotropic etch progresses, ions bombard the horizontally oriented features of dielectric material 58 more frequently than the vertically oriented features. Thus, portions of passivant 60a arranged upon horizontal surfaces undergo ion ablation sufficient to remove passivant 60a from those surfaces. The portions of passivant 60a arranged upon vertical surfaces, however, are not significantly removed. As such, passivant 60b is primarily arranged upon the lateral sidewalls of dielectric material 58b. The portions of passivant 60b arranged upon the upper regions of the sidewalls of dielectric material 58b include passivant originally placed and thereafter accumulated. The sidewalls of dielectric material 58b are extended to a lower level than they had been originally as a result of the anisotropic etch.. Therefore, the portions of passivant 60b arranged upon the lower sidewall regions of dielectric material 58b are exposed to the plasma for a shorter period of time than the portions arranged upon the upper sidewall regions. The passivant is thus not permitted to grow for as long a period upon those lower sidewall regions as upon the upper sidewall regions. As such, the lower sidewall regions of dielectric material 58b do not have as much passivant 60b accumulated thereon. As the anisotropic etch is continued, passivant 60c forms upon dielectric material 58c. In the same manner as described previously, the accumulation of passivant 60c upon the upper regions of the sidewalls of dielectric material 58c is greater than upon the lower regions.

FIG. 8 illustrates the resulting semiconductor topography after the anisotropic etch has been terminated. The width of passivant 60 remaining upon the sidewalls of dielectric material 58 slightly decreases from top to bottom. The width of passivant 60 upon the sidewalls may vary from approximately 10–50 Å to less than 10 Å as it decreases.

As described in block 78 of FIG. 13, dielectric material 58 is then subjected to an isotropic etch. The isotropic etch may be performed using, e.g., a single wafer reactor. Wafer reactors are well known and typically consist of a cylindrical reaction vessel with RF power supplied by metal electrodes placed above and below the cylinder. A plasma sourced with reactant species, such as fluorine-containing molecules may be created within the reaction vessel. The reactant species from the plasma diffuse to exposed surfaces of dielectric material 58, causing those surfaces to be etched. Etching of dielectric material 58 does not involve ion bombardment and thus tends to be primarily isotropic. Passivant 60 substantially inhibits the adjacent dielectric material from being exposed to and significantly etched by the reactant species. Accordingly, those portions of dielectric material 58 not protected by passivant 60 are removed at a faster rate. As the curved regions of dielectric material 58 between its lateral sidewalls and its horizontal surfaces are etched, more regions of the dielectric material become exposed. Since these newly exposed surface regions are not protected by a passivant, they are etched at a relatively high rate. As shown in FIG. 9, sidewall spacers 62 are formed upon the sidewall surfaces of gate conductor 54 as a result of the isotropic etch. The resulting profile of each of the sidewall spacers 62 tapers, or curves inward toward the sidewall surfaces of gate conductor 54 as it approaches substrate 50. The leftmost spacer 62 has a negatively sloping profile while the rightmost spacer 62 has a positively sloping profile. Accordingly, the sidewalls of the resulting spacers 62 taper inward at the base of the spacers.

Figure 10:
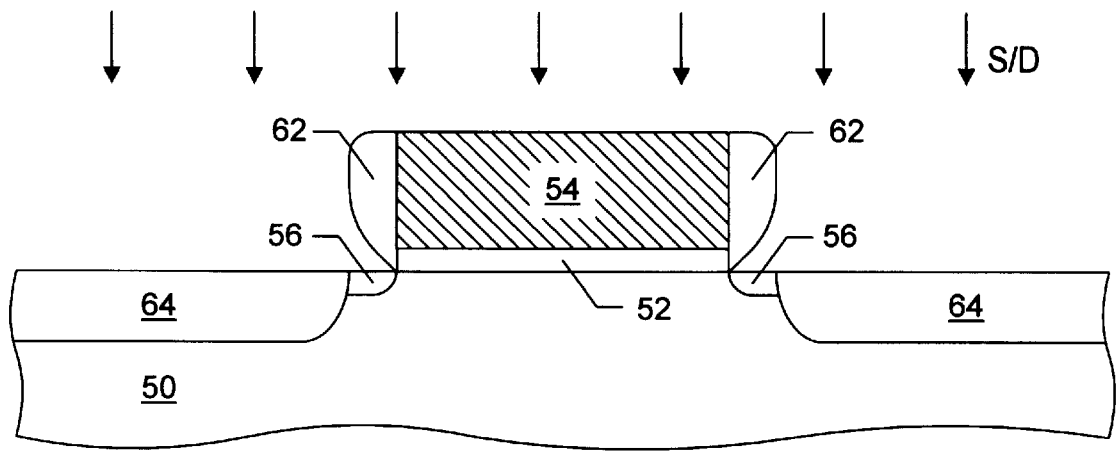
FIG. 10 is a cross-sectional view of the semiconductor topography, wherein a source/drain implant is forwarded into portions of the substrate spaced from the sidewall surfaces of the gate conductor, subsequent to the step in FIG. 9.

Turning to FIG. 10, a heavy concentration source/drain ("S/D") implant is then forwarded into substrate 50 a spaced distance from gate conductor 54 to form source/drain regions 64. Spacers 62 serve to mask portions of substrate 50 from impurities. However, since the thickness of spacers 62 decreases from top to bottom of the spacers, some impurities may become arranged in substrate 50 underneath portions of spacers 62. The concentration of dopants within substrate 50 gradually decreases from LDD areas 56 to source/drain regions 64, thereby forming a graded junction. The dopants used for the S/D implant are of the same type as those used for the LDD implant. Preferably, if a PMOSFET transistor is being formed, ion implantation of p-type species is performed. On the other hand, if an NMOSFET transistor is being formed, n-type species are implanted into substrate 50. Some commonly used n-type dopants are arsenic or phosphorus, and some commonly used p-type dopants are boron or boron difluoride.

Figure 11:
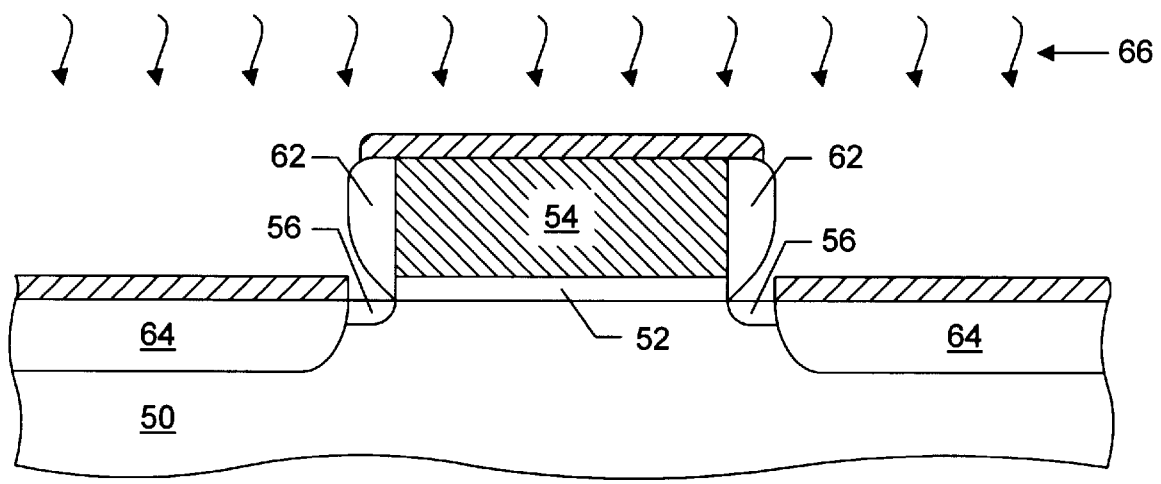
FIG. 11 is a cross-sectional view of the semiconductor topography, wherein a refractory metal is deposited across exposed surfaces of the topography exclusive of the tapering spacer surfaces, subsequent to the step in FIG. 10.
Figure 12:
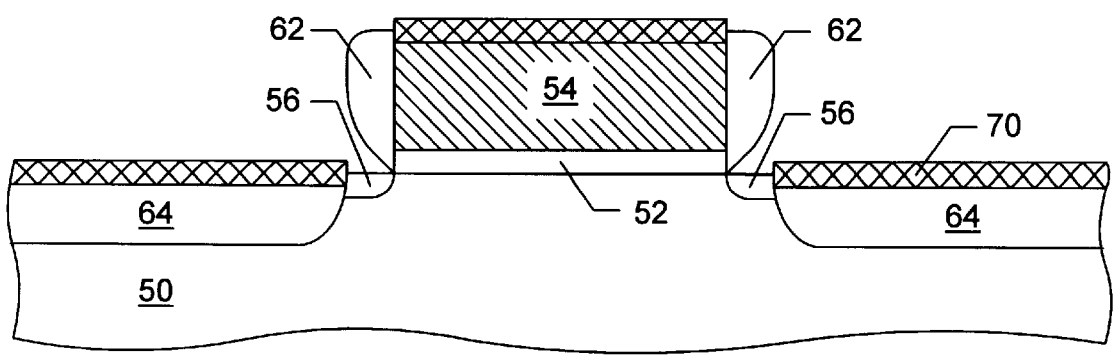
FIG. 12 is a cross-sectional view of the semiconductor topography, wherein a metal salicide is formed upon the gate conductor and the source/drain regions of the substrate, subsequent to the step in FIG. 11.

Turning to FIG. 11, a refractory metal 68, e.g., titanium or cobalt, may be formed across source/drain regions 64 and the peak of spacers 62, and the upper surface of gate conductor 54. Refractory metal 68 may be sputter deposited from a metal target such that it travels in a direction substantially perpendicular to horizontally oriented features. Refractory metal 68 strikes the horizontally oriented peaks of spacers 62 before it can reach the tapered lateral surfaces of the spacers. Thus, refractory metal 68 accumulates upon the peaks of spacers 62 and does not become deposited upon the lower portions of the spacers. The profiles of spacers 62 are advantageously configured to prevent the silicide-forming refractory metal 68 from being deposited upon the lateral surfaces of the spacers. The deposited refractory metal 68 is exposed to a form of radiation 66 capable of increasing the temperature of the refractory metal to above, e.g., 600° C. Radiation 66 may be thermal radiation provided from a heated furnace. Alternately, radiation 66 may be radiant light supplied from, e.g., an arc lamp or a tungsten-halogen lamp using a technique known as rapid thermal processing ("RTP"). The use of RTP to heat refractory metal 68 may reduce the amount of unwanted dopant diffusion into the semiconductor topography as compared to using a high temperature furnace. Raising the temperature of refractory metal 68 serves to initiate reaction between metal atoms and silicon atoms of polysilicon gate conductor 54 and substrate 50. Any unreacted refractory metal which remains may be etched away using, e.g., a wet etch highly selective to the metal. As shown in FIG. 12, a metal salicide 70 results which has a relatively low resistivity and serves as a self-aligned contact region across source/drain regions 64 and gate conductor 54. Absent refractory metal 68 upon the lower portions of spacers 62, no silicide formation occurs at those portions. Consequently, silicide bridging between gate conductor 54 and source/drain regions 62 is less likely to occur.

It will be appreciated to those skilled in the art having the benefit of this disclosure that this invention is believed to provide a method for forming spacers having a tapered profile that is less susceptible to accumulation of a silicide-forming metal adjacent the sidewall surfaces of a transistor gate conductor. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A transistor comprising:
   a gate conductor arranged above a semiconductor substrate between opposed sidewall surfaces; and
   dielectric spacers arranged laterally adjacent said opposed sidewall surfaces, each of said dielectric spacers comprising a varying thickness that decreases from top to bottom of said dielectric spacers such that a greatest thickness of said dielectric spacers is proximate an upper portion of said gate conductor.

2. The transistor of claim 1, further comprising source/drain regions laterally spaced from said gate conductor by said greatest thickness.

3. The transistor of claim 2, further comprising silicide arranged upon said source/drain regions and an upper surface of said gate conductor.

4. The transistor of claim 3, wherein said silicide is arranged exclusive of said dielectric spacers.

5. The transistor of claim 1, wherein said dielectric spacers comprise a material selected from the group consisting of silicon dioxide and silicon nitride.

* * * * *